United States Patent
Dryer et al.

(10) Patent No.: US 7,531,047 B1
(45) Date of Patent: May 12, 2009

(54) METHOD OF REMOVING RESIDUE FROM A SUBSTRATE AFTER A DRIE PROCESS

(75) Inventors: Paul William Dryer, Lexington, KY (US); James Michael Mrvos, Lexington, KY (US); David Bruce Rhine, Georgetown, KY (US)

(73) Assignee: Lexmark International, Inc., Lexington, KY (US)

(*) Notice: Subject to any disclaimer, the term of this patent is extended or adjusted under 35 U.S.C. 154(b) by 0 days.

(21) Appl. No.: 11/954,929

(22) Filed: Dec. 12, 2007

(51) Int. Cl.
*B08B 3/04* (2006.01)

(52) U.S. Cl. .............. 134/28; 216/27; 216/83; 216/96; 438/906; 134/1.1; 134/1.2; 134/1.3; 134/2; 134/3; 134/22.1; 134/22.17; 134/22.18; 134/22.19; 134/26; 134/27; 134/29; 134/30; 134/36; 134/41; 134/42; 134/902

(58) Field of Classification Search ........... 216/27, 216/83, 96; 438/906; 134/1.1, 1.2, 1.3, 2, 134/3, 22.1, 22.17, 22.18, 22.19, 26, 27, 134/28, 29, 30, 36, 41, 42, 902
See application file for complete search history.

(56) References Cited

U.S. PATENT DOCUMENTS

| 5,611,888 | A | 3/1997 | Bosch et al. | |
|---|---|---|---|---|
| 5,626,716 | A | 5/1997 | Bosch et al. | |
| 6,605,230 | B1* | 8/2003 | Liaw et al. | 216/104 |
| 6,828,289 | B2* | 12/2004 | Peters et al. | 510/175 |
| 7,192,864 | B2* | 3/2007 | Lee et al. | 438/637 |
| 2004/0220066 | A1* | 11/2004 | Rutter, Jr. | 510/175 |
| 2005/0205514 | A1* | 9/2005 | Wu et al. | 216/2 |
| 2007/0082491 | A1* | 4/2007 | Uozumi et al. | 438/692 |
| 2007/0134927 | A1* | 6/2007 | Fortin et al. | 438/725 |
| 2007/0134928 | A1* | 6/2007 | Lee et al. | 438/745 |
| 2008/0116167 | A1* | 5/2008 | Uyama | 216/27 |

* cited by examiner

*Primary Examiner*—Sharidan Carrillo
(74) *Attorney, Agent, or Firm*—Luedeka, Neely & Graham PC

(57) ABSTRACT

The present disclosure provides a method of cleaning a semiconductor substrate after a DRIE etch process, wherein residue from the DRIE process is removed without damaging the substrate. The process may include contacting the micro-fluid ejection head with an aqueous solution of TMAH, stripping a photoresist etch mask from the micro-fluid ejection head, and dissolving a passivating coating from the substrate. Then the substrate may be contacted with an acidic solution. The method may further include rinsing and drying the substrate.

5 Claims, 3 Drawing Sheets

METHOD OF REMOVING RESIDUE FROM A SUBSTRATE AFTER A DRIE PROCESS

FIELD OF THE DISCLOSURE

The disclosure relates to etched semiconductor substrates and in particular to methods of improving fluid droplet placement accuracy by removing residues from a micro-fluid ejection head resulting from an etching process.

BACKGROUND AND SUMMARY

With the advent of a deep reactive ion etching (DRIE) process for forming slots and trenches in a substrate material, greater precision and control over the etching of substrates in higher speed processes has been obtained. DRIE is a dry etching process carried out under high vacuum by means of a chemically reactive plasma, wherein the constituents of the plasma are selected in congruence with the substrate to be acted upon. Before the adoption of DRIE techniques to form trenches or slots in semiconductor substrates, most trenches or slots in substrates having a thickness greater than about 200 microns thick were formed by mechanical blasting techniques or chemical *vet etching techniques. However, such mechanical techniques or chemical wet etching techniques are not suitable for newer products which demand higher tolerances and smaller fluid flow trenches or fluid supply slots. DRIE enables deep anisotropic etching of trenches and slots with greater tolerances and without regard to crystal orientation.

DRIE techniques have progressed incrementally towards a goal of etching high aspect ratio features in semiconductor substrates wherein the aspect ratio is on the order of 1:100 width to depth. Hence, much progress has been made in forming conduits or trenches with substantially perpendicular walls or walls having reentrant wall profiles. The process scheme for achieving high aspect ratio slots or trenches in semiconductor substrates includes a series of sequential steps of alternating etching and passivation. Such aniosotropic etching techniques are described in U.S. Pat. Nos. 5,611,888 and 5,626,716 to Bosch et al. the disclosures of which are incorporated herein by reference.

Accordingly, DRIE is a particularly suitable method of forming a fluid supply slot in a micro-fluid ejection head substrate. DRIE is a very desirable method because it has very good shelf control, does not induce chip cracking, and creates a very controllable wall angle profiles.

However, micro-fluid ejection heads made using the DRIE process have experienced an increase in ejected fluid misdirection and/or a decrease in droplet placement accuracy as the size of nozzle holes and flow features in the ejection heads continues to decrease. Such problems were not as evident in ejection heads having relatively larger nozzles and flow features. Accordingly, a need exists for a method of improving droplet placement accuracy for micro-fluid ejection heads. Since micro-fluid ejection heads may often be used as ink-jet print heads, the improvement of droplet placement accuracy may result in a desirable improvement in print quality.

With regard to the foregoing, there is provided a method for treating a substrate after a deep reactive ion etching (DRIE) process used to form fluid supply slots in a micro-fluid ejection head substrate. The method includes removing a residue from the substrate after the DRIE process. The method may include contacting the substrate with an aqueous tetramethyl ammonium hydroxide solution (TMAH). The method may also include stripping a photoresist etching mask from the substrate. The method may further include dissolving a passivating coating from the substrate. As a further step, the substrate may be contacted with an acidic solution then rinsing and drying the substrate.

Another embodiment of the present disclosure may provide a method of removing an $AlF_x$ residue from a substrate after a deep reactive ion etching (DRIE) process. The method may include contacting the micro-fluid ejection head with an aqueous solution of tetramethyl ammonium hydroxide (TMAH). The method may further include stripping a photoresist etch mask from the micro-fluid ejection head. The method may also include dissolving a passivating coating from the substrate. The substrate may then be contacted with an acidic solution before rinsing and drying the substrate.

In another embodiment there is provided a micro-fluid ejection head substantially devoid of $AlF_x$, and made by the aforementioned process.

An advantage of the exemplary process disclosed herein may provide a method of removing an $AlF_x$ residue from a micro-fluid ejection head without adversely affecting the performance of the micro-fluid ejection head. As described in more detail below, it was found that the $AlF_x$ residue was formed during the DRIE process used to etch fluid supply slots through the substrate. It was also discovered that the $AlF_x$ residue, if not thoroughly removed after the DRIE process, may migrate to fluid flow portions of the ejection head. If the residue accumulates in the fluid ejection chamber or nozzles of the ejection head, misdirection of fluid ejection may occur upon ejection of the fluid. Accordingly, it has been found that droplet placement accuracy may be improved by the removal of the residue on the substrate after the DRIE process, which residue was found to comprise $AlF_x$ species.

It is contemplated, and will be apparent to those skilled in the art from the preceding description and the accompanying drawings, that modifications and changes may be made in the embodiments of the disclosure. Accordingly, it is expressly intended that the foregoing description and the accompanying drawings are illustrative of exemplary embodiments only, not limiting thereto, and that the true spirit and scope of the present disclosure be determined by reference to the appended claims.

BRIEF DESCRIPTION OF THE DRAWINGS

Further advantages of the embodiments will become apparent by reference to the detailed description of exemplary embodiments when considered in conjunction with the drawings, wherein like reference characters designate like or similar elements throughout the several drawings as follows.

DETAILED DESCRIPTION OF EXEMPLARY EMBODIMENTS

The present disclosure will now be described in the more limited aspects of preferred embodiments thereof, including various examples and illustrations of the formulation and use of the present disclosure. It will be understood that these embodiments are presented solely for the purpose of illustrating the invention and shall not be considered as a limitation upon the scope thereof.

Figure 1:
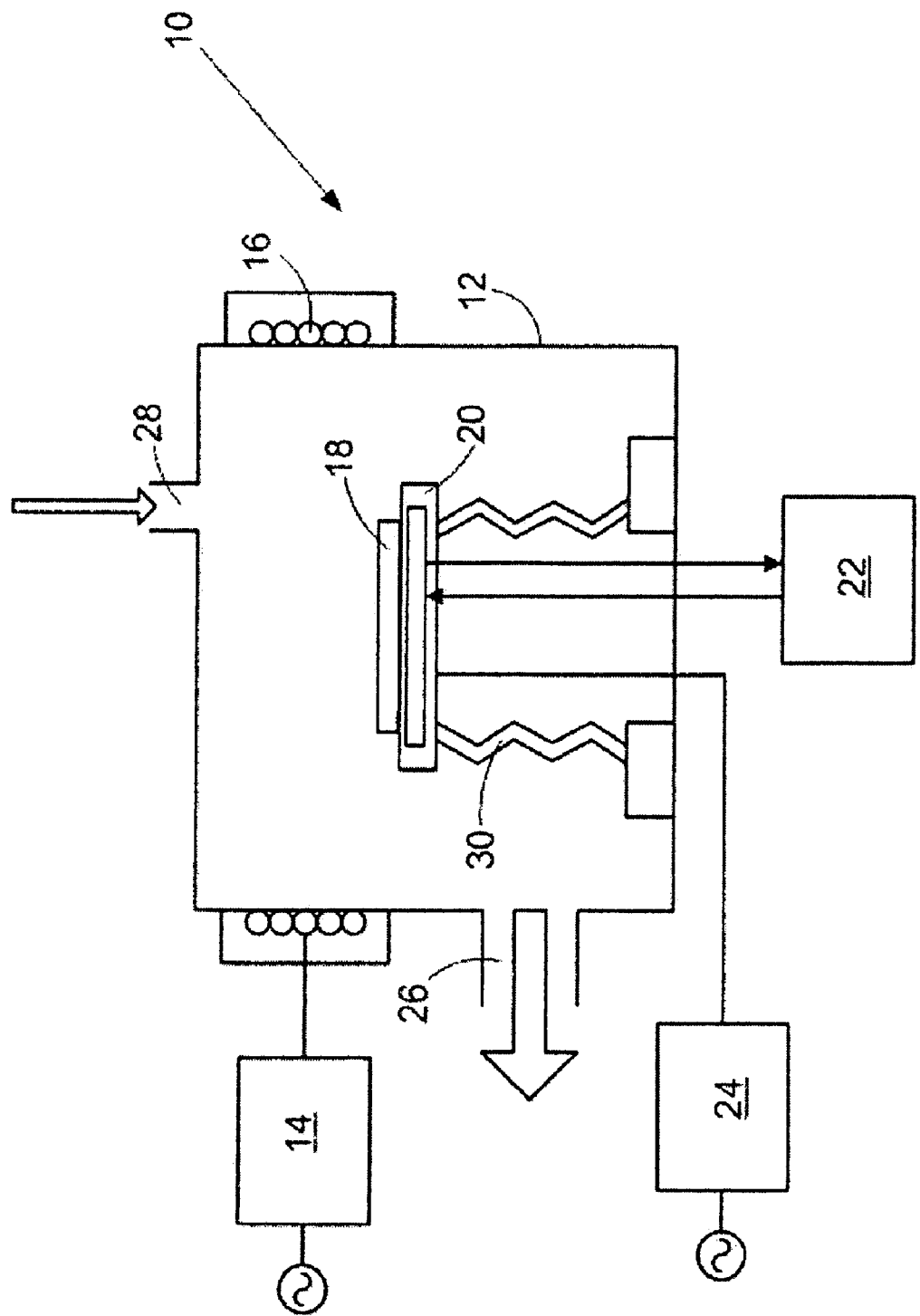
FIG. 1 is a diagrammatic illustration of an inductively coupled plasma system.

With reference to FIG. 1, a deep reactive ion etching (DRIE) system 10, otherwise known as an inductively coupled plasma (ICP) system is illustrated. The system 10 includes a ceramic reaction chamber 12 and a radio frequency (rf) unit 14 for providing source power to a coil 16 to generate a plasma in the reaction chamber 12. A wafer 18 containing a plurality of semiconductor substrates is disposed in the chamber 12 on a cooled electrostatic chuck that is part of platen 20. The temperature of the platen/chuck 20 is controlled by a heat transfer fluid provided by a chiller unit 22. The heat transfer fluid cools a helium gas that is disposed between the platen and the chuck and between the platen/chuck and the wafer 18.

A platen power unit 24 provides rf biasing power to the platen 20 during the etching process. The chamber 12 is maintained at a relatively low pressure during etching by a vacuum pumping unit coupled to a vacuum port 26. A reactive gas is introduced into the chamber through a gas inlet port 28. A bellows system 30 may be provided to adjust a height of the platen 20 before the etching process.

Any gas, under the right conditions may form a plasma. However, gases used in etching or deposition may be chosen strategically to affect particular substrates in a prescribed manner. For example, silicon etching may be primarily accomplished in the presence of fluorine or fluorine evolving gases such as sulfur hexafluoride ($SF_6$). Sulfur hexafluoride undergoes ionization according to the following reaction:

$$SF_6 + e^- \rightarrow S_xF_y^+ + S_xF_y^* + F^* + e^-$$

thereby producing the reactive fluorine radicals which may react with silicon according to the following reaction:

$$Si + F^* SiF_x$$

to produce a volatile gas. A reaction of the fluorine radicals with silicon isotropically etches the silicon.

Isotropic etching, however, is geometrically limited. To produce high aspect ratio features in a silicon substrate with predominantly vertical walls, a directional or anisotropic etch is required. For example, vertical walls may be produced using the DRIE process described above. The DRIE process may include alternating etching and passivating cycles wherein a fluorocarbon polymer ($nCF_2$) is generated to provide a passivating layer during the passivating cycles of the process. Cycling times for each step may range from about 3 to about 20 seconds. The fluorocarbon polymer may be derived from a compound such as octofluorobutane ($C_4F_8$) according to the following reactions:

$$C_4F_8 + e^- \rightarrow CF_x^* + CF_x^* + F^* + e^-$$

$$CF_x^* \rightarrow nCF_2$$

Prior to etching a substrate, a mask may be applied to the substrate or wafer to provide a location for fluid feed slots in the wafer, hereinafter referred to as an "etch box." The etch box may be larger than the fluid feed slots thereby providing a "shelf" adjacent to each of the slots in the etch box. As used herein, "shelf" is defined as the area between an edge of the feed slots and an inner edge of the etch box defining the feed slot location in the substrate. The shelf may be disposed on both sides of each of the slots. A process for etching a silicon substrate to form the fluid feed slots therein is described in U.S. Pat. No. 6,402,301 to Powers et al. and in U.S. Pat. No. 7,202,178 to Krawczyk et al., the disclosures of which is incorporated herein by reference.

In order to achieve an etch that yields a controllable wall angle, it may be necessary to use alternating etching and passivating steps. In the etching step, the substrate is etched slightly. In the passivating step a TEFLON-like passivation layer is deposited on side walls formed in the substrate by the etching step. In the etching step, $SF_6$ may be introduced into the chamber and converted to a plasma. The fluorine species may then be accelerated toward the wafer surface and reacted with the exposed substrate surface. However, as mentioned above, this processing step may etch in all directions (isotropic) if the passivating step is not included. In the passivating step, octofluorocyclobutane ($C_4F_8$) may be introduced into the chamber and converted to a plasma, allowing the TEFLON-like species to condense on all surfaces of the wafer.

When the etching step is repeated, the TEFLON-like material in the bottom of the etching location may be physically sputtered away by the accelerated fluorine species. The TEFLON-like material on the side walls of the etching location may not removed because the slight reentrant angle prevents direct line of sight sputtering. After the TEFLON-like passivation is physically removed from the bottom of the etching location, the fluorine species may then chemically react with the substrate and etching may occur. These steps may be repeated multiple times to yield a fluid supply slot etched through the entire wafer. The end result of the DRIE process is an anisotropicily etched fluid supply slot having a slight reentrant angle, and having sidewalls coated with the TEFLON-like material.

During the DRIE process, a unique set of circumstances may occur. The DRIE etch gas, such as sulfur hexafluoride ($SF_6$), may be in contact with $Al_2O_3$ or AlN source ceramics in the plasma chamber 12. Under normal dry etching conditions, the ceramic materials may be very resistant to etching or sputtering. However, when the plasma is ignited and subjected to an extremely high voltage (i.e. 3000V), which is unique to the DRIE process, a portion of the ceramic material may be consumed by the plasma and redeposited as an $AlF_x$ residue on the wafer surface after each of the etching steps of the process, wherein x is an integer of 3 or more.

In the past, after the DRIE process was complete, the wafer was cleaned using an acetone/KCl soak to solubilize the bulk of the photoresist etch mask. Then, a high pressure acetone/KCl spray was applied to physically remove any baked on resist. The wafer was then contacted with a hydrofluoroether solvent, to remove the passivation layer from the sidewalls of the fluid supply slots. Finally, the wafer was subjected to a high temperature bake to remove any acetone or hydrofluoroether solvent.

While the prior art process may have been effective to clean the wafer after a DRIE process, the problem of droplet misdirection has occurred as the nozzles and flow features have decreased in size. Droplet misdirection has been found to be linked to incomplete removal of residue from the DRIE process. It was found that any residue or debris remaining on the substrate may be redeposited in the nozzles or flow feature areas of the ejection head thus causing an undesirable flight path (misdirection) for the ejected fluid. X-Ray Photoelectron Spectroscopy (XPS) was used to analyze the surface composition of the wafer before and after the DRIE. Table I shows X-Ray Photoelectron Spectroscopy (XPS) data regarding the source of the Al for the $AlF_x$ specie's found in the residue that has migrated to flow feature areas and nozzles of an ejection head.

TABLE 1

|  | At % Si | At % C | At % O | At % F | At % Al |
|---|---|---|---|---|---|
| Etch mask after DRIE | 0 | 26.92 | 3.37 | 60.44 | 9.27 |
| Second Spot | 0 | 35.85 | 2.58 | 55.46 | 6.11 |
| Control (No DRIE) | 0 | 72.42 | 27.58 | 0 | 0 |
| Passivation scraped from ceramics | 0 | 14.19 | 7.39 | 52.56 | 23.91 |

The data in Table I clearly show that Al was present on the wafer after the DRIE process, with 9.27% Al present in the etch mask, and 6.11% present at a second spot on the wafer. The control shows that no Al was present before the wafer is exposed to DRIE, as the percentage of Al initially present on the wafer is 0%. The last line item is a sample of a TEFLON-like passivation layer scraped from the chuck in the DRIE chamber. The passivation layer also contained a high concentration of $AlF_x$, with 23.91% Al present. Accordingly, the data clearly indicate that Al from the chamber ceramics was being deposited on the wafer, as well as throughout the chamber, during the DRIE process.

Figure 2:
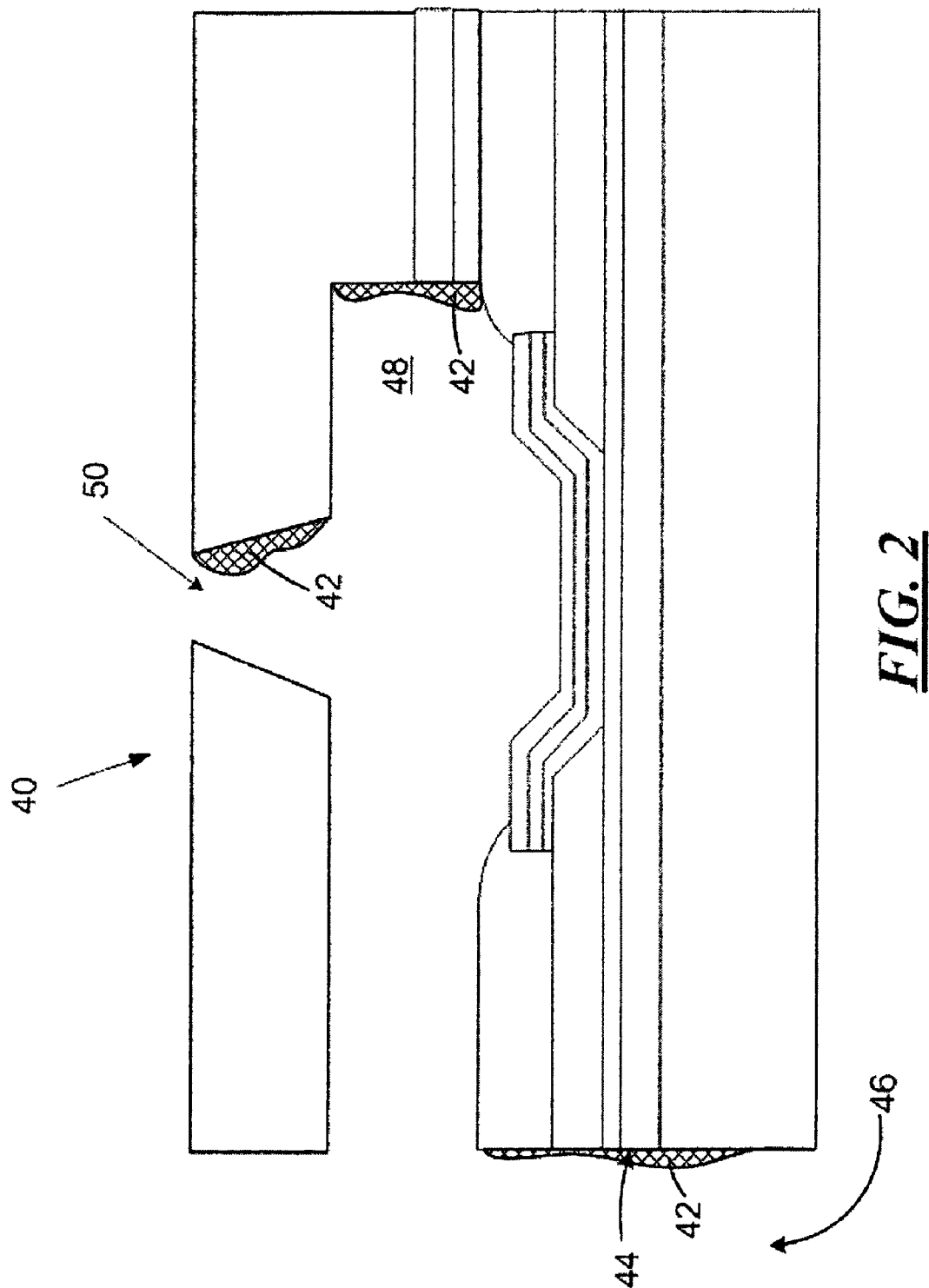
FIG. 2 is a diagrammatic illustration of a cross section of a micro-fluid ejection head showing $AlF_x$ residue in a fluid supply slot, a flow feature, and a nozzle.

FIG. 2 is a diagrammatic illustration of a cross sectional view of a portion of a micro-fluid ejection device 40 showing $AlF_x$ residue 42 on a side wall 44 of a fluid supply slot 46, in a fluid ejection chamber 48, and in a nozzle 50 of the device 40. This residue 42 was from the DRIE process, as discussed above, and may cause fluid ejected from the chamber 48 through nozzle 50 to be misdirected as it is ejected toward a target or medium. Accordingly, it is desirable to remove the residue 42 in order to improve fluid droplet placement accuracy.

Figure 3:
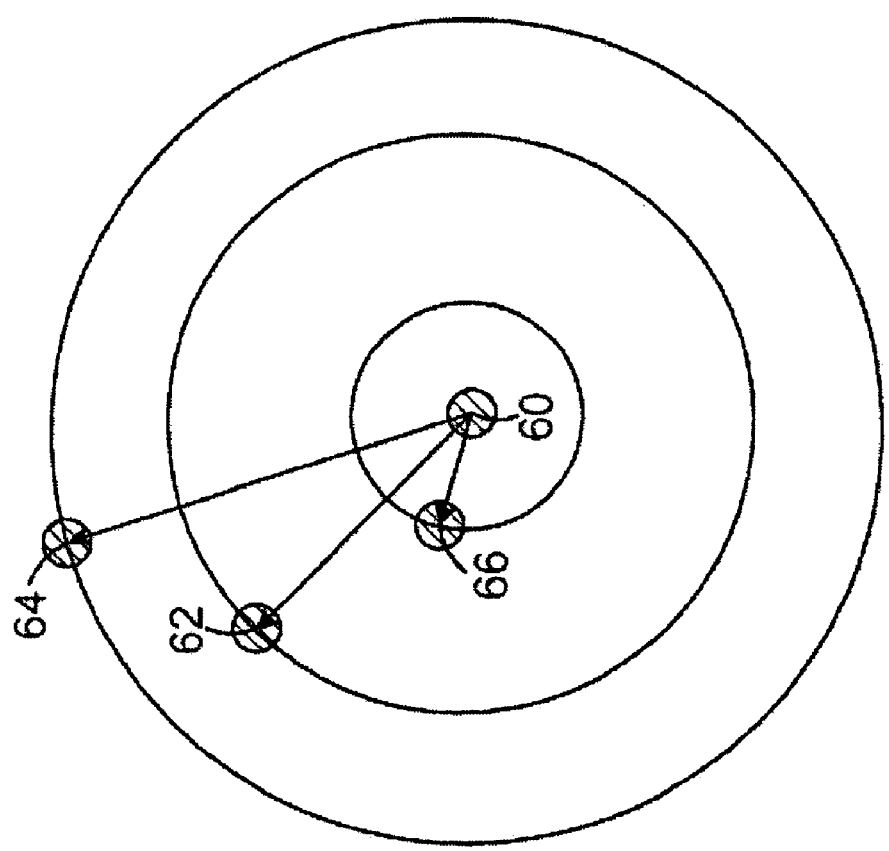
FIG. 3 is a diagram illustrating ideal droplet placement and droplet misdirection parameters.

In order to further understand how droplet placement may be effected by the $AlF_x$ residue, FIG. 3 is used to illustrate a capability radius 32 for a nozzle. The "capability radius" of the nozzle is defined as a distance from an ideal location 60 on a target or medium for fluid droplets ejected from the ejection head 40. Droplet misdirection results when fluid droplets are deposited in locations remote from the ideal location 60. For example, when a droplet is ejected from the ejection head 40 under ideal conditions, it may not deviate from a straight line path between the nozzle and the target or medium, thus striking the ideal location 60. If there is residue contaminating the firing chamber 48 or nozzle 50, then the fluid droplet may strike nonideal locations 62 or 64 distal from the ideal location 60 as shown in FIG. 3. In order to facilitate more accurate droplet placement, it is desirable to have a smaller capability radius, and more desirable to have a tight radius indicated by droplet location 66.

The present disclosure may provide methods for removing the residue and dramatically improving droplet placement accuracy. Two methods were found for removing the $AlF_x$ residue. The two methods are washing the substrate with a solution of TMAH and a surfactant, and washing the substrate with a mixture of glacial acetic acid and ammonium fluoride in dimethylacetamide. Both methods will be discussed below, and the cleaning processes of the present disclosure may incorporate one or both residue removing methods.

TMAH and Surfactant:

It is believed that the $AlF_x$ residue generated in the DRIE tool may be very similar to $AlF_3*3H_2O$ salt, and may therefore have similar solubility properties. In the below experiment, $AlF_3*3H_2O$ salt was dissolved in various solvents and the solubilities of $AlF_3$ in the solvents were determined. Table 2 is a table showing the solubility of $AlF_3* 3H_2O$ in various solvents used in a substrate cleaning process.

In accordance with the solubility data of the $AlF_3$ salt, it has been observed that a solution of tetramethyl ammonium hydroxide (TMAH) may be very effective at solubilizing the $AlF_x$ residue. A suitable concentration of TMAH may range from about 1 to about 10 percent by weight of the total solution. A further suitable concentration of TMAH may range from about 2 to about 5 percent by weight of the total weight of the solution. In one embodiment, the concentration of TMAH may be about 2.38% by weight of the total weight of the solution.

The data in Table 2 indicates that $AlF_3*3H_2O$ salt may be very soluble in TMAH, as compared to the other solvents, with a solubility of about 22,765 ppm in TMAH.

TABLE 2

| Solvent | Solubility ppm $AlF_3*3H_2O$ |
|---|---|
| Hexane | 0 |
| Acetone/KCl | 17.793 |
| HFE7300 | 57.25 |
| DI Water/IPA | 126.952 |
| Silane/Ethanol | 150.062 |
| PGMEA | 258.659 |
| IPA | 267.76 |
| Cyclohexanone | 1677.11 |
| GPTM Silane | 4352.06 |
| DI Water | 7316.499 |
| 2.38% TMAH | 22765 |

In the DRIE process, the $AlF_x$ residue on the wafer may be may be mixed with the TEFLON-like passivation layer which is very hydrophobic. Since the passivation layer makes the surface hydrophobic, the 2.38% TMAH solution may not be effective to wet the surface sufficiently to dissolve the $AF_x$ residue. In order to improve the wettability properties, a surfactant may be added to the TMAH solution. A suitable concentration of surfactant may range from about 0.001 to about 0.1 percent by weight of the total solution, and in one embodiment the concentration of surfactant may be about 0.0119 percent by weight. In another embodiment, about 2.5 g of surfactant may be used for about every 500 g of TMAH.

One suitable surfactant may be commercially available as NOVEC FC4300 from 3M Company of St. Paul, Minn. The NOVEC FC4300 surfactant is a mixture containing about 20% by weight of ammonium fluoroalkylsulfonate and about 80% by weight of glacial acetic acid. Other comparable surfactants may also be used with the TMAH solution. With the addition of the surfactant, the TMAH solution may sufficiently wet the passivated surface and allow the solution to enter very small geometries to dissolve the $AlF_x$ residue. Table 3 below shows XPS data verifying that the TMAH/surfactant solution may effectively remove the $AlF_x$ residue from a substrate.

TABLE 3

| Sample | At % Al | At % C | At % O | At % F | At % Si | At % N |
|---|---|---|---|---|---|---|
| Control Resist Surface | 3.59 | 33.72 | 2.37 | 60.31 | 0.00 | 0.00 |
| Control fluid slot Walls | 1.49 | 33.68 | 1.14 | 61.28 | 2.40 | 0.00 |
| TMAH & Surfactant Resist Surface | 0.00 | 39.31 | 1.65 | 59.04 | 0.00 | 0.00 |
| TMAH & Surfactant fluid slot walls | 0.00 | 33.73 | 0.97 | 62.19 | 3.11 | 0.00 |

The control samples show the amount of aluminum atoms and fluoride atoms on the resist and the fluid slot walls when the substrate was removed from the DRIE chamber 12. In the control sample, the resist surface contained about 3.59% Al, and the fluid slot walls contained about 1.49% Al. After being contacted with the TMAH and surfactant solution, the resist surface and the fluid slot walls contained 0.00% Al. The data in Table 3 shows that the TMAH solution removed the $AlF_x$ residue, so that after treatment with the TMAH and surfactant solution, all contacted surfaces may be substantially devoid of $AlF_x$.

NE-14

An alternative method found to be effective for removing the $AlF_x$ residue is a commercial mixture sold under the trade name NE-14 from Air Products. The NE-14 solution is a mixture of glacial acetic acid and ammonium fluoride in dimethylacetamide. The mixture may contain from about 1 to about 5 percent by weight of ammonium fluoride, from about 10 to about 20 percent by weight of glacial acetic acid, and from about 50 to about 60 weight percent of dimethylacetamide, with the balance water. It is believed that the ammonium fluoride in the NE-14 solvent may convert the $AlF_x$ from a water-insoluble residue to a soluble salt, as shown in the below reaction:

$$AlF_3 + NH_4F \rightarrow NH_4AlF_4$$

The $NH_4AlF_4$ salt is very soluble in water. Therefore, some of the converted salt may be removed by dissolving the aluminum salt in the NE-14 solution, which may contain some water, and the remainder of the aluminum salt may be removed in a subsequent water rinse step. The glacial acetic acid may be added to buffer the solution to a pH ranging from about 3 to about 6. In one embodiment, the solution may have a pH of about 4.7. By using dimethylacetamide as a solvent instead of water and maintaining a pH of about 4.7, the etch rate of aluminum metal on the substrate may be very low, i.e. about 4 to about 6 Angstroms per minute.

Photoresist Stripping Process

In a previously known substrate cleaning process, the post DRIE photoresist stripping process may include soaking the substrate in acetone/KCl. The concentration of KCl may range from about 1 to about 20 ppm, with the balance of the solution being acetone. A particularly suitable concentration of KCl may range from about 5 to about 15 ppm in acetone. In one embodiment, the concentration of KCl may be 8 ppm in acetone. A high pressure acetone/KCl spray may be applied to the substrate, followed by soaking the substrate in a hydrofluoroether solvent (HFE) in a wet bench. Excess solvent may be removed by baking the substrate at about 175° C. for about 70 min.

The HFE may be a commercially available hydrofluoroether, such as NOVEC 7300 or NOVEC 7500, available from 3M Company. NOVEC 7300 is 3-ethoxy-1,1,1,2,3,4,4,5,5,6,6,6-docdecafluoro-2-trifluoromethylhexane. NOVEC 7500 is 2-trifluoromethyl-3-ethoxydodecafluorohexane.

The photoresist stripping process described above, however, is not effective to remove the $AlF_x$ residue, as shown in Table 2. In order to remove the $AlF_x$ residue and not adversely affect the photoresist stripping process, embodiments of the present disclosure have incorporated both TMAH and NE-14 solvent washes.

In accordance with an aspect of the present disclosure, the substrate may be first soaked in an aqueous solution of TMAH and a surfactant. The substrate may then be rinsed with water and dried. The process may further include soaking the substrate in acetone/KCl. A high pressure acetone/ KCl spray may then be applied to the substrate, followed with soaking the substrate in HFE in a wet bench to remove the photoresist material from the substrate. Excess solvent may be removed by baking the substrate at about 175° C. for about 70 min.

After stripping the photoresist from the substrate, the process may also include soaking the substrate in the NE-14 solvent. The substrate may then be rinsed with water and dried.

By using the aforementioned process, substantially all of the $AlF_x$ residue may be removed from the substrate. An aqueous solution of TMAH and a surfactant was chosen as the first step to remove the bulk of the residue before stripping the photoresist. If most of the residue is not removed before stripping the photoresist from the substrate, the residue may contaminate the acetone/KCl soak bath and/or the HFE bath. Since the residue is not soluble in either of these solutions, the $AlF_x$ may reside in the baths as particles which may redeposit on the wafers. Also, the TMAH solution has a pH of about 13 which is very corrosive to exposed Al metal. Since the photoresist is covering the metal layers containing aluminum on the wafer prior to the photoresist stripping step, the metal layers are protected from the TMAH solution.

The NE-14 step was chosen as the last step in the process to remove any $AlF_x$ residue that was covered by the TEFLON-like polymer. Unlike the TMAH solution, the buffered NE-14 solution will not corrode the Al metal and is also effective at removing the TEFLON-like polymer. Table 4 below shows XPS data verifying the effectiveness of this cleaning sequence on a substrate.

TABLE 4

| Sample | At % Al | At % C | At % O | At % F | At % Si | At % K | At % I |
|---|---|---|---|---|---|---|---|
| Old process resist surface | 0.00 | 80.85 | 19.09 | 0.26 | 0.00 | 0.00 | 0.07 |
| New process resist surface | 0.00 | 83.10 | 16.84 | 0.00 | 0.00 | 0.00 | 0.06 |
| Old process fluid slot surface | 5.53 | 16.41 | 27.86 | 11.83 | 37.82 | 1.10 | 0.00 |
| New process fluid slot surface | 0.00 | 10.82 | 31.27 | 0.80 | 57.05 | 0.00 | 0.00 |

The data in Table 4 shows that a process of the present disclosure may be effective for removing the Al residue on the fluid slot surfaces, as 0.00% Al was present on the fluid slot surfaces after cleaning. Also, the fluorine levels were greatly reduced as compared to the previously known cleaning process. Table 5 shows a dramatic improvement in droplet placement accuracy when using a cleaning sequence in accordance with the present disclosure.

TABLE 5

| Wafer | Capability Radius μm | % Nozzles 0 to 10 μm | % Nozzles 10 to 20 μm | % Nozzles 20 to 40 μm | % Nozzles >40 μm | Yield 1 Nozzle per Color >40 |
|---|---|---|---|---|---|---|
| A | 41.00 | 81.86% | 15.12% | 2.53% | 0.50% | 34% |
| B | 54.00 | 74.10% | 22.09% | 2.81% | 1.00% | 12% |
| C | 46.00 | 72.75% | 20.28% | 2.57% | 0.61% | 32% |
| D | 44.00 | 50.73% | 38.42% | 5.11% | 0.21% | |
| E | 29.00 | 91.15% | 8.20% | 0.15% | 0.12% | 77% |
| F | 23.00 | 93.01% | 5.78% | 0.56% | 0.03% | 94% |
| G | 23.00 | 94.11% | 5.26% | 0.19% | 0.09% | 96% |

Wafers E, F, and G were cleaned using the TMAH and NE-14 solution cleaning sequence, and showed dramatic improvement over wafers A-D that were cleaned using the previously known process. The most critical metric in this table is the capability radius, the concept of which is illustrated by FIG. 3. The capability radius describes the distance that a drop of fluid is displaced from the ideal droplet placement location 60. The smaller the capability radius, the more accurate the droplet placement. Also, for wafers E, F, and G, over 90% of the nozzles were misdirected by 10 μm or less, which was quite an improvement over ejection heads made by the prior art cleaning process. The prior art cleaning process resulted in ejection heads having an average capability radius of 46.251 μm while the cleaning process according to the disclosure resulted in ejection heads having an average capability radius of 25 μm.

At numerous places throughout this specification, reference has been made to a number of U.S. patents. All such cited documents are expressly incorporated in full into this disclosure as if fully set forth herein.

Other embodiments of the present disclosure will be apparent to those skilled in the art from consideration of the specification and practice of the embodiments disclosed herein. As used throughout the specification and claims, "a" and/or "an" may refer to one or more than one. Unless otherwise indicated, all numbers expressing quantities of ingredients, properties such as molecular weight, percent, ratio, reaction conditions, and so forth used in the specification and claims are to be understood as being modified in all instances by the term "about." Accordingly, unless indicated to the contrary, the numerical parameters set forth in the specification and claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. It is intended that the specification and examples be considered as exemplary only, with a true scope and spirit of the invention being indicated by the following claims.

The patentees do not intend to dedicate any disclosed embodiments to the public, and to the extent any disclosed modifications or alterations may not literally fall within the scope of the claims, they are considered to be part hereof under the doctrine of equivalents.

What is claimed is:

1. A method of removing AlFx residue from a substrate after a deep reactive ion reactive etching process, comprising the sequential steps of:
    contacting the substrate with an aqueous solution of tetramethyl ammonium hydroxide and a surfactant;
    soaking the substrate with a mixture of acetone and KCl;
    contacting the substrate with a hydrofluoroether composition;
    heating the substrate to about 175° C. for about 70 minutes;
    contacting the substrate with a mixture comprising glacial acetic acid, ammonium fluoride, and dimethylacetamide;
    rinsing the substrate with water; and
    drying the substrate;
    wherein after performing the rinsing and drying steps, the substrate is substantially free of residue AlFx.

2. The method of claim 1, wherein the surfactant ranges from about 0.001 to about 0.1 percent by weight of the total solution.

3. The method of claim 1, wherein the residue comprises AlFx, and wherein x is 3.

4. The method of claim 1, wherein the step of soaking the substrate with a mixture of acetone and KCl comprises contacting the substrate with an amount of acetone and an amount of KCl, wherein the amount of acetone is substantially greater than the amount of KCl.

5. The method of claim 1, further comprises applying a spray of acetone and KCl mixture to the substrate, after the step of soaking the substrate with the mixture of acetone and KCl.

* * * * *